United States Patent
Ha et al.

(10) Patent No.: US 7,968,373 B2
(45) Date of Patent: Jun. 28, 2011

(54) INTEGRATED CIRCUIT PACKAGE ON PACKAGE SYSTEM

(75) Inventors: Jong-Woo Ha, Seoul (KR); JooSang Kim, Icheon-si (KR); DongSoo Moon, Ichon-si (KR)

(73) Assignee: Stats Chippac Ltd., Singapore (SG)

( * ) Notice: Subject to any disclaimer, the term of this patent is extended or adjusted under 35 U.S.C. 154(b) by 104 days.

(21) Appl. No.: 12/114,744

(22) Filed: May 2, 2008

(65) Prior Publication Data

US 2009/0273094 A1 Nov. 5, 2009

(51) Int. Cl.
*H01L 21/00* (2006.01)
(52) U.S. Cl. ............... 438/109; 257/686; 257/E23.141
(58) Field of Classification Search .......... 257/686, 257/777; 438/109
See application file for complete search history.

(56) References Cited

U.S. PATENT DOCUMENTS

| | | | |
|---|---|---|---|
| 5,422,435 A * | 6/1995 | Takiar et al. | 174/521 |
| 7,262,475 B2 | 8/2007 | Kwon et al. | |
| 7,282,788 B2 | 10/2007 | Chen | |
| 7,294,897 B2 | 11/2007 | Akram et al. | |
| 7,321,455 B2 | 1/2008 | Kinsman | |
| 7,327,005 B2 | 2/2008 | Brechignac et al. | |
| 2008/0157319 A1 | 7/2008 | Ha | |
| 2009/0079091 A1 * | 3/2009 | Song et al. | 257/777 |

* cited by examiner

*Primary Examiner* — Chuong A Luu
*Assistant Examiner* — Nga Doan
(74) *Attorney, Agent, or Firm* — Mikio Ishimaru

(57) ABSTRACT

An integrated circuit package on package system including: forming a first substrate assembly; forming a second substrate, having an auxiliary access port, supported by the first substrate assembly; exposing an integrated circuit die through the auxiliary access port; and coupling an external integrated circuit on the second substrate.

20 Claims, 4 Drawing Sheets

INTEGRATED CIRCUIT PACKAGE ON
PACKAGE SYSTEM

TECHNICAL FIELD

The present invention relates generally to integrated circuit packaging, and more particularly to a system for applications using a package on package configuration.

BACKGROUND ART

Microelectronic devices are used in cell phones, pagers, personal digital assistants, computers, and many other products. A die-level packaged microelectronic device can include a microelectronic die, an interposer substrate or lead frame attached to the die, and a molded casing around the die. The microelectronic die generally has an integrated circuit and a number of bond-pads coupled to the integrated circuit. The bond-pads are coupled to terminals on the interposer substrate or lead frame. The interposer substrate can also include system interconnect pads coupled to the terminals by traces in a dielectric material. An array of solder balls is configured so that each solder ball contacts a corresponding system interconnect pad to define a "ball-grid" array. Packaged microelectronic devices with ball-grid arrays are generally higher grade packages that have lower profiles and higher pin counts than conventional chip packages that use a lead frame.

Packaged microelectronic devices are typically made by (a) forming a number of dice on a semiconductor wafer, (b) cutting the wafer to singulate the dice, (c) attaching an individual die to an individual interposer substrate, (d) wire-bonding the bond-pads to the terminals of the interposer substrate, and (e) encapsulating the dies with a molding compound. As the demand for higher pin counts and smaller packages increases, it becomes more difficult to (a) form robust wire-bonds that can withstand the forces involved in molding processes and (b) accurately form other components of die-level packaged devices. Therefore, packaging processes have become a significant factor in producing semiconductor and other microelectronic devices.

Electronic products require packaged microelectronic devices to have an extremely high density of components in a very limited space. For example, the space available for memory devices, processors, displays, and other microelectronic components is quite limited in cell phones, PDAs, portable computers, and many other products. As such, there is a strong drive to reduce the height of the packaged microelectronic device and the surface area or "footprint" of the microelectronic device on a printed circuit board. Reducing the size of the microelectronic device is difficult because high-performance microelectronic devices generally have more bond-pads, which result in larger ball-grid arrays and thus larger footprints.

Image sensors present additional packaging problems. Image sensors include an active area that is responsive to light or other electromagnetic radiation. In packaging, it is important to form a cover that protects the active area without obstructing or distorting the passage of light or other electromagnetic radiation to the active area. One existing method for packaging an image sensor die includes placing the die in a recess of a ceramic substrate and attaching a glass window to the substrate over the active area. The window is hermetically sealed to the substrate to enclose the image sensor die. A vacuum pump typically removes air from the gap between the image sensor die and the glass window. An inert gas can then be injected into the gap between the image sensor die and the glass window.

Another existing method for packaging image sensor dies by attaching and wire-bonding an array of image sensor dies to a carrier substrate. Next, a crystal window array is placed over the image sensor dice. The crystal window array includes sidewalls that are attached to the carrier substrate between the wire-bonds of adjacent dies and windows that extend between the sidewalls over corresponding dice. The substrate and the attached window array are then cut to form a number of individual image sensor packages.

One drawback of packaging image sensor dies in the above-mentioned methods is that the packaged image sensor dice are relatively bulky and, accordingly, use more space on a circuit board or other external device.

Thus, a need still remains for an integrated circuit package on package system that can provide a platform for image sensors, improve layout efficiency on the application printed circuit board, and improve thermal efficiency. In view of the overwhelming demand for more integrated circuit functions in smaller spaces, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides an integrated circuit package on package system including: forming a first substrate assembly; forming a second substrate, having an auxiliary access port, supported by the first substrate assembly; exposing an integrated circuit die through the auxiliary access port; and coupling an external integrated circuit on the second substrate.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

Figure 1:
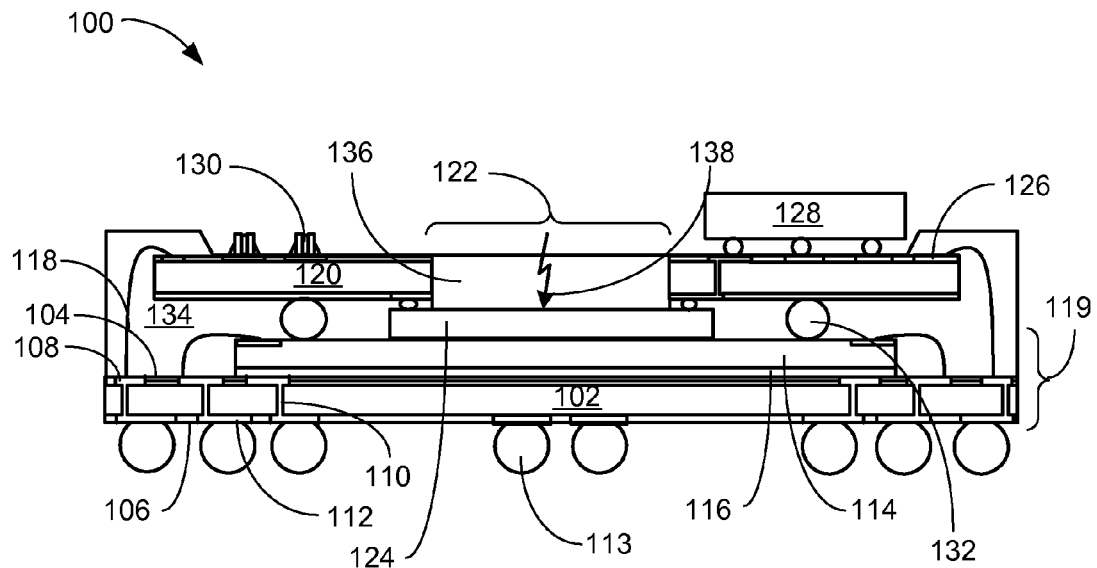
FIG. 1 is a cross-sectional view of an integrated circuit package on package system, in an embodiment of the present invention.

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the substrate of the integrated circuit package on package system, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "system" as used herein means and refers to the method and to the apparatus of the present invention in accordance with the context in which the term is used. The term "processing" as used herein includes stamping, forging, patterning, exposure, development, etching, cleaning, and/or removal of the material or laser trimming as required in forming a described structure.

Referring now to FIG. 1, therein is shown a cross-sectional view of an integrated circuit package on package system 100 for package on package applications, in an embodiment of the present invention. The cross-sectional view of the integrated circuit package on package system 100 depicts a first substrate 102, such as a laminate substrate, a ceramic substrate, or a flex circuit, having a component side 104 and a system side 106. The component side 104 may have a contact pad 108 for forming an electrical connection. An interconnect via 110 may couple the contact pad 108 to a system pad 112 positioned on the system side 106 of the first substrate 102. A system interconnect 113, such as a solder ball, a solder bump, a solder column, or a stud bump, may be coupled to the system pad 112.

A first integrated circuit 114 may be mounted on the component side 104 by an adhesive 116, such as a die attach material. The first integrated circuit 114 may be electrically connected to the contact pad 108 by an electrical interconnect 118, such as a bond wire. The first integrated circuit 114 may be positioned with the active side facing away from the first substrate 102. In the event that the first integrated circuit 114 may be a flip chip integrated circuit, the active side would face the first substrate 102. The first integrated circuit 114 may also be a shielded radio frequency package, a pre-molded package, or an internal stacking module in an inverted position. A first substrate assembly 119 may include the first substrate 102, the first integrated circuit 114, and the electrical interconnect 118.

A second substrate 120 having an auxiliary access port 122 may be supported by the first substrate assembly 119. The second substrate 120 may have an integrated circuit die 124, such as a flip chip integrated circuit die, coupled to its bottom side. The integrated circuit die 124 may contact the first integrated circuit 114, but no electrical connection is made through this contact. The second substrate 120 may have the contact pad 108 on the bottom side for forming the electrical connection to the integrated circuit die 124. The second substrate 120 may have an expansion pad 126 on the top side for forming an electrical connection between the first substrate 102, an external integrated circuit 128, a discrete component 130, or a combination thereof. The second substrate 120 may provide a fan-in capability by supporting electrical connections within the integrated circuit package on package system 100. This fan-in process may simplify the design of the next level system (not shown).

The external integrated circuit 128 may be any previously tested device including a flip chip integrated circuit die, a flip chip integrated circuit package, a leaded package, or a combination thereof. The discrete component 130 may be a resistor, a capacitor, an inductor, a diode, a voltage regulator, or a combination thereof.

A support member 132, such as an adhesive member, may be positioned between the bottom side of the second substrate 120 and the active side of the first integrated circuit 114. The support member 132 may be an optional device that can stabilize the second substrate 120, during the wire bond process, when the electrical interconnect 118 may be coupled between the expansion pad 126 and the contact pad 108.

A molded package body 134, such as an epoxy molding compound, may be formed on the first substrate 102, the second substrate 120, the integrated circuit die 124, the support member 132, or a combination thereof. The auxiliary access port 122 may remain clear of the molded package body 134, thus leaving the active surface of the integrated circuit die 124, positioned under the auxiliary access port 122, exposed. A transparent filler 136, such as a glass insert or a transparent molding compound, may be formed in the auxiliary access port 122. The transparent filler 136 may act as a lens for the integrated circuit die 124 by focusing a light 138 on the active side of the integrated circuit die 124. The transparent filler 136 may also form an air tight seal with the second substrate 120.

Figure 2:
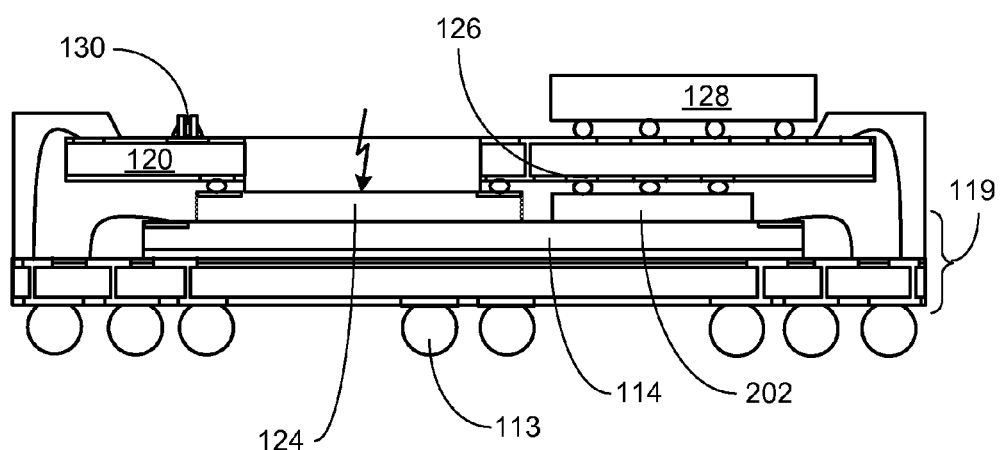
FIG. 2 is a cross-sectional view of an integrated circuit package on package system, in an alternative embodiment of the present invention.

Referring now to FIG. 2, therein is shown a cross-sectional view of an integrated circuit package on package system 200, in an alternative embodiment of the present invention. The cross-sectional view of the integrated circuit package on package system 200 depicts the first substrate 102 having the first integrated circuit 114 coupled thereon. The second substrate 120 may be supported by the first substrate assembly 119. The integrated circuit die 124 may be coupled to the bottom side of the second substrate 120. An embedded support chip 202, such as an integrated circuit die, may be coupled to the bottom side of the second substrate 120 as well.

The embedded support chip 202 may be coupled to the expansion pad 126 on the bottom side of the second substrate 120. The inactive side of both the integrated circuit die 124 and the embedded support chip 202 may contact the active side of the first integrated circuit 114 though no electrical connection is formed by that contact.

The external integrated circuit 128 may be electrically connected to the integrated circuit die 124, the embedded support chip 202, the discrete component 130, the first integrated circuit 114, the system interconnect 113, or a combination thereof. Each of these devices may be pre-tested and known to be good prior to assembling the integrated circuit package on package system 200. This aspect of the present invention may provide an increased manufacturing yield.

The number and position of the embedded support chip 202 is an example only and the actual number or position may differ. The embedded support chip 202 is shown as a flip chip integrated circuit die, but this is by way of an example only. The actual embedded support chip 202 may be a shielded radio frequency package, a pre-molded package, a leaded package, or an internal stacking module in an inverted position.

Figure 3:
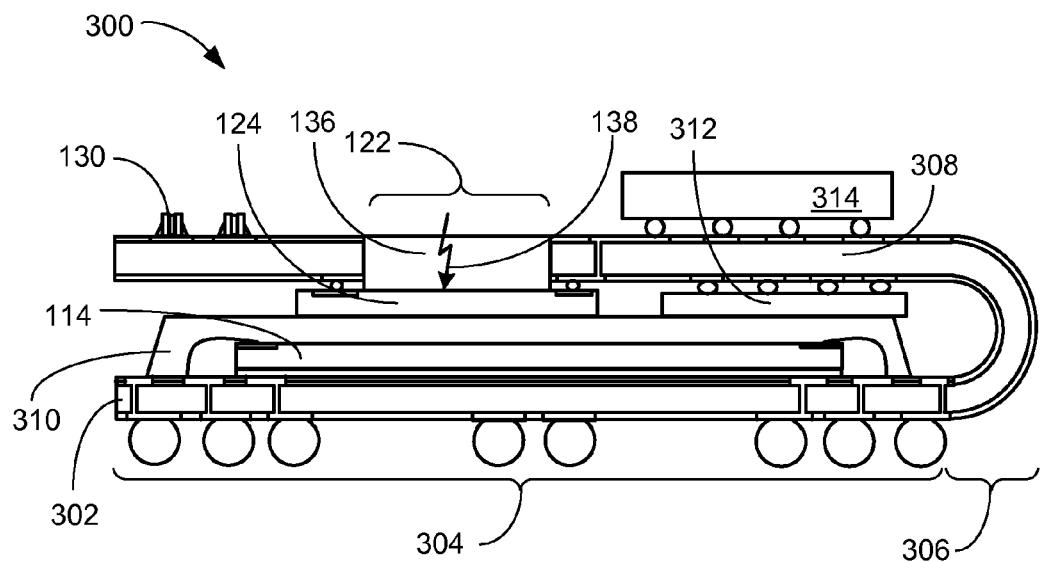
FIG. 3 is a cross-sectional view of an integrated circuit package on package system, in a second alternative embodiment of the present invention.

Referring now to FIG. 3, therein is shown a cross-sectional view of an integrated circuit package on package system 300, in a second alternative embodiment of the present invention. The cross-sectional view of the integrated circuit package on package system 300 depicts a flexible substrate 302, such as a flex circuit, having a lower segment 304, a transition segment 306, and an upper segment 308. The first integrated circuit 114 may be coupled to the lower segment 304. A molded cap 310 may optionally be formed on the lower segment 304 and the first integrated circuit 114.

The first integrated circuit 114 is shown as a wire bond type of integrated circuit, but this is an example only and the actual type of the first integrated circuit 114 may be a flip chip integrated circuit, a shielded radio frequency package, a pre-molded package, or an internal stacking module. The transition segment 306 may provide an electrical connection from the lower segment 304 to the upper segment 308.

The integrated circuit die 124 may be coupled to the upper segment 308 having the auxiliary access port 122. A first expansion chip 312, such as a flip chip integrated circuit, may be coupled to the upper segment 308 adjacent to the integrated circuit die 124. The integrated circuit die 124 and the first expansion chip 312 may contact the molded cap 310 for support. Optionally, the adhesive 116, of FIG. 1, may be applied between the integrated circuit die 124, the first expansion chip 312, and the molded cap 310.

A second expansion chip 314 may be coupled to a surface, of the upper segment, opposing the surface to which the first expansion chip 312 is coupled. The transparent filler 136, such as a glass insert or a transparent molding compound, may be formed in the auxiliary access port 122 for focusing the light 138 on the active side of the integrated circuit die 124. The discrete component 130 may be coupled to either surface of the upper segment 308.

Figure 4:
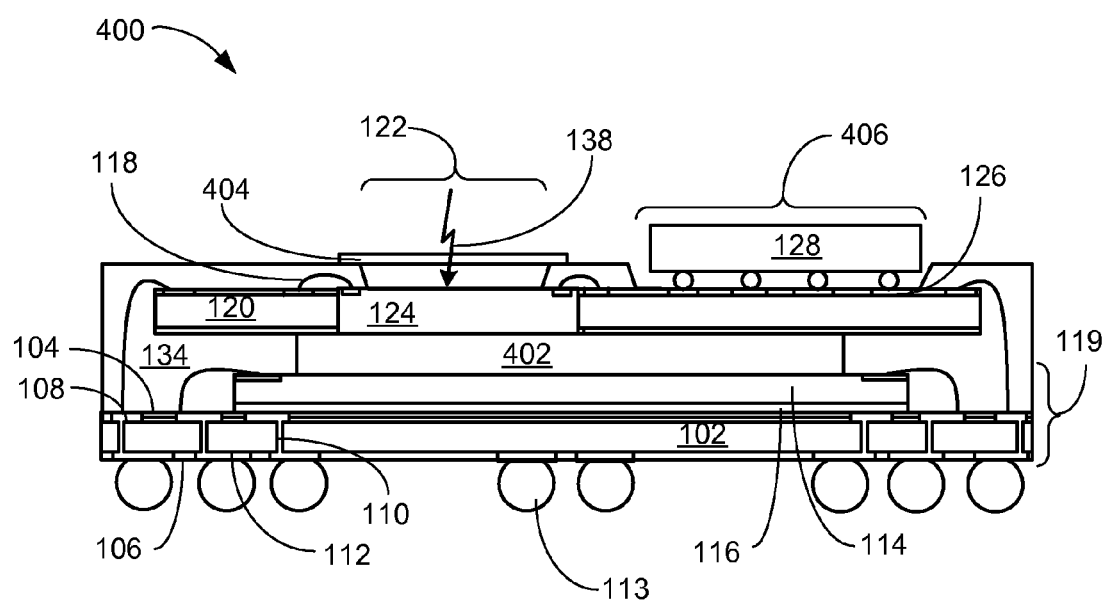
FIG. 4 is a cross-sectional view of an integrated circuit package on package system, in a third alternative embodiment of the present invention.

Referring now to FIG. 4, therein is shown a cross-sectional view of an integrated circuit package on package system 400, in a third alternative embodiment of the present invention. The cross-sectional view of the integrated circuit package on package system 400 depicts the first substrate 102, such as a laminate substrate, a ceramic substrate, or a flex circuit, having the component side 104 and the system side 106. The component side 104 may have the contact pad 108 for forming the electrical connection. The interconnect via 110 may couple the contact pad 108 to the system pad 112 positioned on the system side 106 of the first substrate 102. The system interconnect 113 may be coupled to the system pad 112.

The first integrated circuit 114 may be mounted on the component side 104 by the adhesive 116. The first integrated circuit 114 may be electrically connected to the contact pad 108 by the electrical interconnect 118. The first integrated circuit 114 may be positioned with the active side facing away from the first substrate 102. In the event that the first integrated circuit 114 may be a flip chip integrated circuit, the active side would face the first substrate 102. The first substrate assembly 119 may include the first substrate 102, the first integrated circuit 114, and the electrical interconnect 118.

The second substrate 120 having the auxiliary access port 122 may be supported by the first substrate assembly 119. An adhesive spacer 402 may be positioned between the first integrated circuit 114 and the second substrate 120. The second substrate 120 may have the integrated circuit die 124 positioned within the auxiliary access port 122 and coupled to the second substrate 120 by the electrical interconnects 118. The adhesive spacer 402 is an example only and any suitable spacer may be used. This may include a wire in film layer formed on the entire bottom surface of the second substrate 120.

The molded package body 134 may be formed on the first substrate 102, the second substrate 120, the integrated circuit die 124, the electrical interconnects 118, or a combination thereof. The auxiliary access port 122 may remain clear of the molded package body 134, thus leaving the active surface of the integrated circuit die 124 exposed. A window 404 may be positioned on the molded package body 134 for providing a protective surface over the integrated circuit die 124 or focusing the light 138.

The external integrated circuit 128 may be coupled to the expansion pads 126 left in an exposed area 406 of the second substrate 120 not covered by the molded package body 134. The size, position, and number of the external integrated circuit 128 are by way of example only and the actual size, position or number may vary. The discrete component 130, of FIG. 1, may also be positioned on the exposed area 406 of the second substrate 120.

Figure 5:
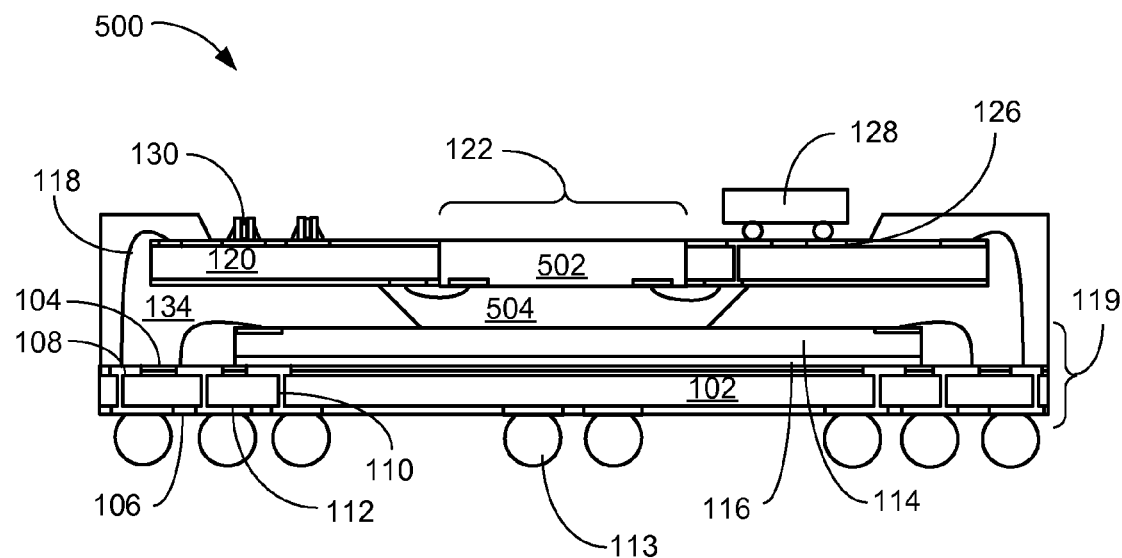
FIG. 5 is a cross-sectional view of an integrated circuit package on package system, in a fourth alternative embodiment of the present invention.

Referring now to FIG. 5, therein is shown a cross-sectional view of an integrated circuit package on package system 500, in a fourth alternative embodiment of the present invention. The cross-sectional view of the integrated circuit package on package system 500 depicts the first substrate 102, such as a laminate substrate, a ceramic substrate, or a flex circuit, having the component side 104 and the system side 106. The component side 104 may have the contact pad 108 for forming the electrical connection. The interconnect via 110 may couple the contact pad 108 to the system pad 112 positioned on the system side 106 of the first substrate 102. The system interconnect 113 may be coupled to the system pad 112.

The first integrated circuit 114 may be mounted on the component side 104 by the adhesive 116. The first integrated circuit 114 may be electrically connected to the contact pad 108 by the electrical interconnect 118. The first integrated circuit 114 may be positioned with the active side facing away from the first substrate 102. In the event that the first integrated circuit 114 may be a flip chip integrated circuit, the active side would face the first substrate 102. The first substrate assembly 119 may include the first substrate 102, the first integrated circuit 114, and the electrical interconnect 118.

The second substrate 120 having the auxiliary access port 122 may be supported by the first substrate assembly 119. An integrated circuit die 502, such as a thermally enhanced chip, may be mounted within the auxiliary access port 122, in a chip in board configuration. The integrated circuit die 502 may be coupled to the second substrate 120 by the electrical interconnects 118. A molded cap 504 may be formed on the integrated circuit die 502, the electrical interconnects 118, and the second substrate 120. The molded cap 504 may act as a support between the first integrated circuit 114 and the second substrate 120.

The molded package body 134 may be formed on the first substrate 102, the second substrate 120, the first integrated circuit 114, the molded cap 504, the electrical interconnects 118, or a combination thereof. The external integrated circuit 128 may be coupled to the expansion pads 126 on the second substrate 120 not covered by the molded package body 134. The size, position, and number of the external integrated circuit 128 are examples only and the actual size, position or number may vary. The discrete component 130 may also be positioned on the second substrate 120.

The inactive side of the integrated circuit die 502 may be exposed on the top side of the second substrate 120. This exposed portion of the integrated circuit die 502 may provide enhanced thermal performance. An external heat sink (not shown) may optionally be attached to the exposed portion of the integrated circuit die 502.

Figure 6:
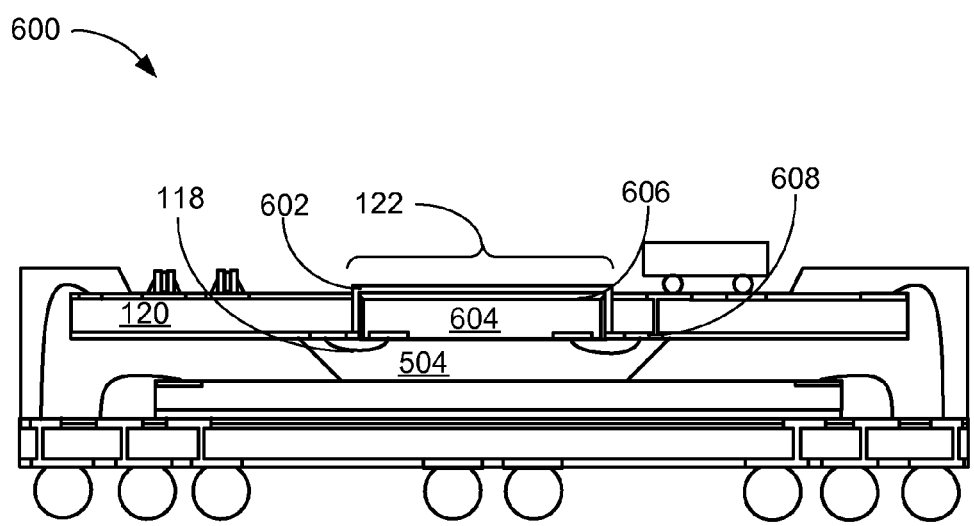
FIG. 6 is a cross-sectional view of an integrated circuit package on package system, in a fifth alternative embodiment of the present invention.

Referring now to FIG. 6, therein is shown a cross-sectional view of an integrated circuit package on package system 600, in a fifth alternative embodiment of the present invention. The cross-sectional view of the integrated circuit package on package system 600 depicts a thermally conductive stiffener 602, such as a metal stiffener, positioned in the auxiliary access port 122 of the second substrate 120. An integrated circuit die 604 may be mounted in the thermally conductive stiffener 602 by a thermal adhesive 606, such as a thermal epoxy. The integrated circuit die 604 may be coupled to a contact pad 608 on the bottom of the second substrate 120 by the electrical interconnect 118.

The molded cap 504 may be formed on the thermally conductive stiffener 602, the integrated circuit die 604, the electrical interconnects 118, the contact pad 608, or a combination thereof. The size of the thermally conductive stiffener 602 and the integrated circuit die 604 are an example only and the actual size may differ. The top of the thermally conductive stiffener 602 may be exposed for enhanced thermal performance. It may optionally be attached to an external heat sink (not shown).

Figure 7:
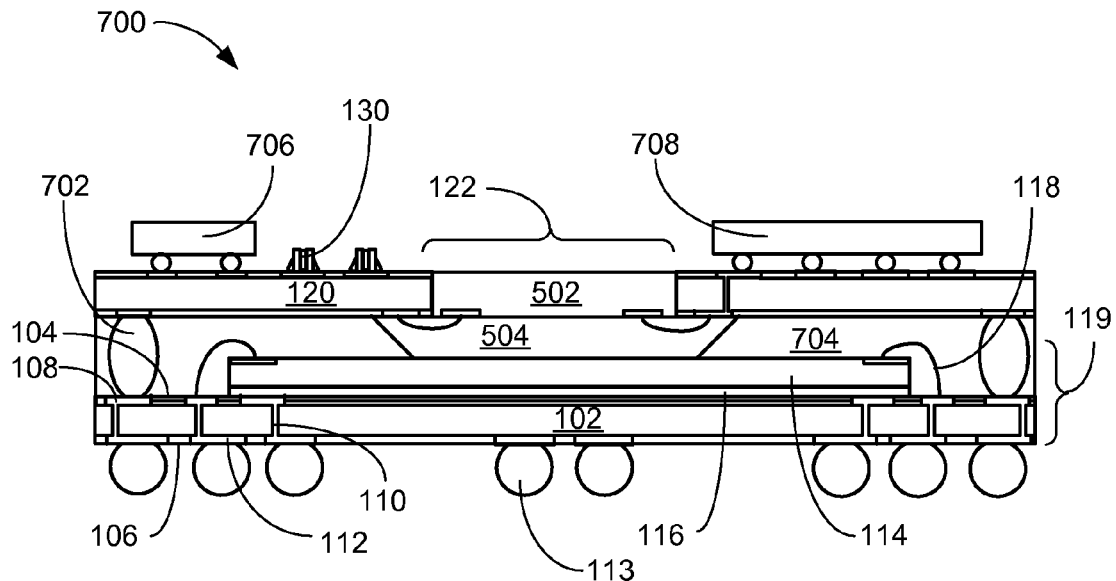
FIG. 7 is a cross-sectional view of an integrated circuit package on package system, in a sixth alternative embodiment of the present invention.

Referring now to FIG. 7, therein is shown a cross-sectional view of an integrated circuit package on package system 700, in a sixth alternative embodiment of the present invention. The cross-sectional view of the integrated circuit package on package system 700 depicts the first substrate 102 having the component side 104 and the system side 106. The component side 104 may have the contact pad 108 for forming the electrical connection. The interconnect via 110 may couple the contact pad 108 to the system pad 112 positioned on the system side 106 of the first substrate 102. The system interconnect 113 may be coupled to the system pad 112 for connecting the next level system (not shown).

The first integrated circuit 114 may be mounted on the component side 104 by the adhesive 116. The first integrated circuit 114 may be electrically connected to the contact pad 108 by the electrical interconnect 118. The first integrated circuit 114 may be positioned with the active side facing away from the first substrate 102. In the event that the first integrated circuit 114 may be a flip chip integrated circuit, the active side would face the first substrate 102. The first substrate assembly 119 may include the first substrate 102, the first integrated circuit 114, and the electrical interconnect 118.

The second substrate 120 having the auxiliary access port 122 may be supported by the first substrate assembly 119. The integrated circuit die 502 may be mounted within the auxiliary access port 122, in a chip in board configuration. The integrated circuit die 502 may be coupled to the second substrate 120 by the electrical interconnects 118. The molded cap 504 may be formed on the integrated circuit die 502, the electrical interconnects 118, and the second substrate 120. The molded cap 504 may act as a support between the first integrated circuit 114 and the second substrate 120.

A package interconnect 702, such as a solder ball, solder column, solder bump, or stud bump, may couple the first substrate 102 to the second substrate 120. A molded package body 704 may be formed on the first substrate 102, the first integrated circuit 114, the electrical interconnects 118, the second substrate 120, the molded cap 504, and the package interconnect 702. The exposed top surface of the second substrate 120 may have a first expansion chip 706 and a second expansion chip 708 mounted thereon. The discrete components 130 may also be coupled to the top surface of the second substrate 120.

This configuration may allow an electrical connection between the first integrated circuit 114, the integrated circuit die 502, the first expansion chip 706, the second expansion chip 708, the discrete components 130, the system interconnects 113, or a combination thereof. The exposed surface of the integrated circuit die 502 may be available for enhanced thermal performance, or optional connection to the external heat sink (not shown).

Figure 8:
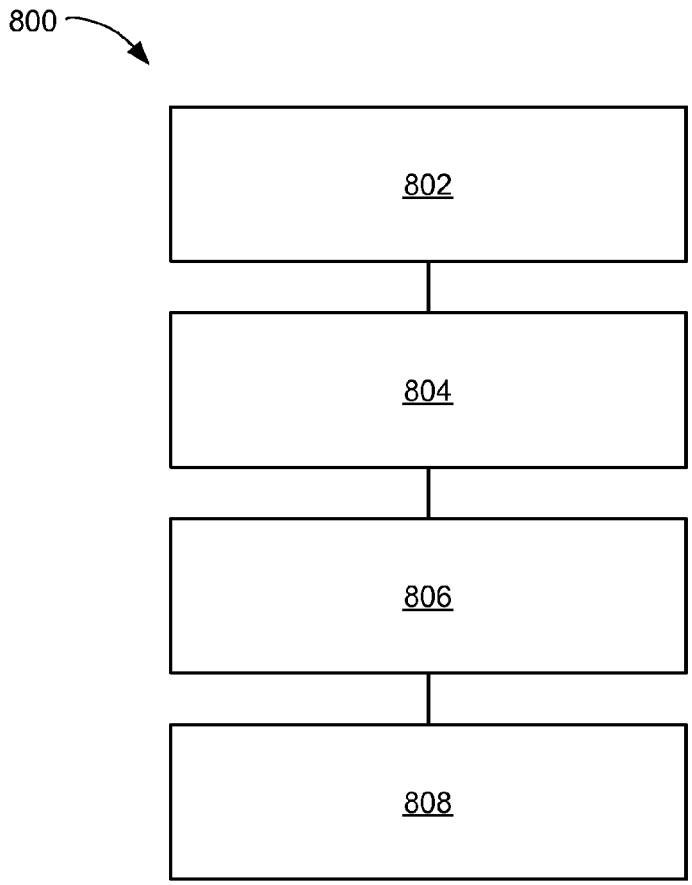
FIG. 8 is a flow chart of an integrated circuit package on package system for manufacturing the integrated circuit package on package system in an embodiment of the present invention.

Referring now to FIG. 8, therein is shown a flow chart of an integrated circuit package on package system 800 for manufacturing the integrated circuit package on package system 100 in an embodiment of the present invention. The system 800 includes forming a first substrate assembly in a block 802; forming a second substrate, having an auxiliary access port, supported by the first substrate assembly in a block 804; exposing an integrated circuit die through the auxiliary access port in a block 806; and coupling an external integrated circuit on the second substrate in a block 808.

Thus, it has been discovered that the integrated circuit package on package system of the present invention furnishes important and heretofore unknown and unavailable solutions, capabilities, and functional aspects for designing and manufacturing integrated circuit packages that may reduce the routing complexity of the application printed circuit board. The resulting processes and configurations are straightforward, cost-effective, uncomplicated, highly versatile and effective, can be surprisingly and unobviously implemented by adapting known technologies, and are thus readily suited for efficiently and economically manufacturing multi-function integrated circuit devices fully compatible with conventional manufacturing processes and technologies. The resulting processes and configurations are straightforward, cost-effective, uncomplicated, highly versatile, accurate, sensitive, and effective, and can be implemented by adapting known components for ready, efficient, and economical manufacturing, application, and utilization.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacturing an integrated circuit package on package system comprising:
    forming a first substrate assembly;

forming a second substrate, having an auxiliary access port, supported by the first substrate assembly;
exposing an integrated circuit die through the auxiliary access port by attaching the integrated circuit die under the auxiliary access port and electrically coupling the integrated circuit die to only the second substrate; and
coupling an external integrated circuit on the second substrate.

2. The method as claimed in claim 1 further comprising forming a transparent filler over the integrated circuit die for focusing a light.

3. The method as claimed in claim 1 further comprising coupling a discrete component on the second substrate.

4. The method as claimed in claim 1 wherein forming the first substrate assembly includes:
providing a first substrate;
mounting a first integrated circuit on the first substrate; and
coupling an electrical interconnect between the first integrated circuit and the first substrate.

5. The method as claimed in claim 1 further comprising providing a support member for stabilizing the second substrate.

6. A method of manufacturing an integrated circuit package on package system comprising:
forming a first substrate assembly having a contact pad;
forming a second substrate, having an auxiliary access port, supported by the first substrate assembly including coupling an electrical interconnect between the first substrate assembly and the second substrate;
exposing an integrated circuit die through the auxiliary access port by attaching the integrated circuit die, under the auxiliary access port, and electrically coupling to only the second substrate including positioning an optical sensor chip or a thermally enhanced chip by the auxiliary access port; and
coupling an external integrated circuit on the second substrate including coupling a discrete component.

7. The method as claimed in claim 6 further comprising forming a transparent filler over the integrated circuit die for focusing a light including forming a transparent molding compound or positioning a glass insert.

8. The method as claimed in claim 6 further comprising providing a flexible substrate for folding the flexible substrate to form the second substrate.

9. The method as claimed in claim 6 wherein forming the first substrate assembly includes:
providing a first substrate;
mounting a first integrated circuit on the first substrate; and
contacting an embedded support chip and the integrated circuit die by the first integrated circuit.

10. The method as claimed in claim 6 further comprising providing a support member for stabilizing the second substrate wherein stabilizing the second substrate includes providing a molded cap, an adhesive spacer, a package interconnect, a thermally conductive stiffener, or a combination thereof.

11. An integrated circuit package on package system comprising:
a first substrate assembly;
a second substrate, having an auxiliary access port, supported by the first substrate assembly;
an integrated circuit die exposed through the auxiliary access port includes the integrated circuit die attached under the auxiliary access port and electrically coupled to only the second substrate; and
an external integrated circuit on the second substrate.

12. The system as claimed in claim 11 further comprising a transparent filler over the integrated circuit die for focusing a light.

13. The system as claimed in claim 11 further comprising a discrete component on the second substrate.

14. The system as claimed in claim 11 wherein the first substrate assembly includes:
a first substrate;
a first integrated circuit on the first substrate; and
an electrical interconnect between the first integrated circuit and the first substrate.

15. The system as claimed in claim 11 further comprising a support member for stabilizing the second substrate.

16. The system as claimed in claim 11 further comprising:
a contact pad on the first substrate assembly;
an electrical interconnect between the first substrate assembly and the second substrate;
an optical sensor chip or a thermally enhanced chip positioned by the auxiliary access port; and
a discrete component coupled to the second substrate.

17. The system as claimed in claim 16 further comprising a transparent filler over the integrated circuit die for focusing a light includes a transparent molding compound or a glass insert over the integrated circuit die.

18. The system as claimed in claim 16 further comprising a flexible substrate folded forms the second substrate.

19. The system as claimed in claim 16 wherein the first substrate assembly includes:
a first substrate;
a first integrated circuit on the first substrate; and
an embedded support chip and the integrated circuit die on the first integrated circuit.

20. The system as claimed in claim 16 further comprising a support member for stabilizing the second substrate wherein the second substrate stabilized includes a molded cap, an adhesive spacer, a package interconnect, a thermally conductive stiffener, or a combination thereof between the first substrate assembly and the second substrate.

* * * * *